United States Patent
Galeotti et al.

(10) Patent No.: US 7,484,900 B2
(45) Date of Patent: Feb. 3, 2009

(54) AIR CAVITY PLASTIC PACKAGE FOR HIGH FREQUENCY OPTICAL DEVICES

(75) Inventors: Roberto Galeotti, Cremona (IT); Luigi Gobbi, Milan (IT); Mario Bonazzoli, Cremona (IT)

(73) Assignee: Avanex Corporation, Fremont, CA (US)

( * ) Notice: Subject to any disclaimer, the term of this patent is extended or adjusted under 35 U.S.C. 154(b) by 0 days.

(21) Appl. No.: 11/538,890

(22) Filed: Oct. 5, 2006

(65) Prior Publication Data

US 2008/0085084 A1    Apr. 10, 2008

(51) Int. Cl.
*G02B 6/36* (2006.01)

(52) U.S. Cl. .............................. 385/94; 385/53; 385/88; 385/92

(58) Field of Classification Search .................. 385/53, 385/88, 92, 94
See application file for complete search history.

(56) References Cited

U.S. PATENT DOCUMENTS

| | | | |
|---|---|---|---|
| 4,953,001 A | * | 8/1990 | Kaiser et al. ................ 257/664 |
| 5,664,043 A | * | 9/1997 | Donaldson et al. .......... 385/138 |
| 2002/0190359 A1 | | 12/2002 | Shaw et al. |
| 2005/0058411 A1 | * | 3/2005 | Finot et al. ..................... 385/94 |

* cited by examiner

*Primary Examiner*—Jennifer Doan
(74) *Attorney, Agent, or Firm*—Patterson & Sheridan, LLP

(57) ABSTRACT

The present invention generally relates to an air cavity plastic package for a high frequency optical device. In one aspect, a module package for a high frequency optoelectronic device is provided. The module package includes an upper plastic housing having an upper cavity formed therein and a lower plastic housing having a lower cavity formed therein. The upper housing and the lower housing are configured to mate together such that the cavities form an enclosed air cavity between the housings. Additionally, upon creating a seal between the housings, an optical feed through is realized. The module package further includes a plurality of conductors disposed in the lower housing, each conductor having an upper end and a lower end, wherein the upper end is connectable to a chip disposed in the air cavity and the lower end is connectable to a board. In another aspect, a method of packaging and assembling a high frequency optical device is provided. In yet another aspect, a package assembly for an electro-optical modulator is provided.

24 Claims, 3 Drawing Sheets

AIR CAVITY PLASTIC PACKAGE FOR HIGH FREQUENCY OPTICAL DEVICES

BACKGROUND OF THE INVENTION

1. Field of the Invention

The present invention generally relates to optical devices. More particularly, the invention relates to packaging for optoelectronic devices.

2. Description of the Related Art

An optoelectronic device is a device that is configured to promote the interconversion of electricity and light. One example of an optoelectronic device is an electro-optical modulator. In order to protect the optoelectronic device from the surrounding environment, the optoelectronic device is typically disposed in a sealed housing or a package.

Conventionally, the package for the optoelectronic device is made from a high-cost hermetic metal material or a ceramic material. The package includes electrical connections through a wall of the package. The electrical connections are made by a ceramic feedthrough or a glass to metal seal around a coaxial connector in order to bring an electrical signal to the electrodes of the optoelectronic device. The electrical connections from a conductor pin or a connector on the package to the electrodes on a chip of the optoelectronic device are either made by directly soldering to the pin or by ceramic strip lines.

The package is also configured to allow optical fibers to pass through a wall of the package. For a hermetic package, a seal between the package wall and the optical fibers must be established and maintained. The optical fibers provide an optical feed through to the optoelectronic device. The optical fibers are generally fixed to the chip in the optoelectronic device by means of fiber-blocks and UV curable adhesive in order to transmit the optical signal through the optical waveguides in the chip. The chip in the optoelectronic device is typically fixed directly onto a base of the package or onto a submount fixed to the base of the package with a face-up or a flip chip technique.

In addition to the conventional metal or ceramic packages for the optoelectronic device, the package may also be made from a plastic material. Similar to the conventional packages, the plastic package includes electrical connections through a wall of the package and optical feed throughs. Although the plastic package provides a tangible cost reduction relative to the conventional packages, the plastic package requires the use of a material, such as silicon, to encapsulate the optoelectronic device in order to protect the device from moisture. The use of the material (silicon) in the plastic package, however, reduces the performance of the optoelectronic device. For instance, an optoelectronic device disposed in a plastic package and encapsulated by silicon does not have acceptable performance beyond 2.5 GHz.

As the foregoing illustrates, there is a need in the art for a plastic module package that is configured to allow the optoelectronic device to perform at a higher bandwidth than the prior art appreciates.

SUMMARY OF THE INVENTION

The present invention generally relates to an air cavity plastic package for a high frequency optical device. In one aspect, a module package for a high frequency optoelectronic device is provided. The module package includes an upper plastic housing having an upper cavity formed therein and a lower plastic housing having a lower cavity formed therein. The upper housing and the lower housing are configured to mate together such that the cavities form an enclosed air cavity between the housings. Additionally, upon creating a seal between the upper housing and the lower housing, an optical feed through is realized. The module package further includes a plurality of conductors disposed in the lower housing, each conductor having an upper end and a lower end, wherein the upper end is connectable to a chip disposed in the air cavity and the lower end is connectable to a board.

In another aspect, a method of packaging and assembling a high frequency optical device is provided. The method includes the step of providing a lower plastic housing having a lower cavity formed therein, wherein the lower plastic housing includes a plurality of conductors disposed therein. The method further includes the step of placing a chip in the cavity of the lower plastic housing such that a chip contacts a portion of the plurality of conductors. Finally, the method includes the steps of mating an upper plastic housing with the lower plastic housing such that an air cavity is formed between the housings and creating a seal between the upper and lower housings.

In yet another aspect, a package assembly for an electro-optical modulator is provided. The package assembly includes an upper plastic body having an upper cavity formed therein. The package assembly further includes a lower plastic body having a lower cavity formed therein and a plurality of conductors, wherein the upper and lower bodies are configured to mate together such that the cavities form an enclosed air cavity between the bodies. Finally, the package assembly includes a chip disposed in the air cavity such that the chip contacts the plurality of conductors.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION

In general, the present invention relates to an air cavity plastic package for a high frequency optical device. The air cavity plastic package will be described herein in relation to an electro-optical modulator. Generally, the electro-optical modulator is a device that employs an applied electrical field to alter the polarization properties of light. However, it should be understood that the invention is not limited to the electro-optical modulator. Rather, the invention may also be employed with other high frequency optical devices without departing from the principles of the present invention. To better understand the novelty of the apparatus of the present invention and the methods of use thereof, reference is hereafter made to the accompanying drawings.

Figure 1:
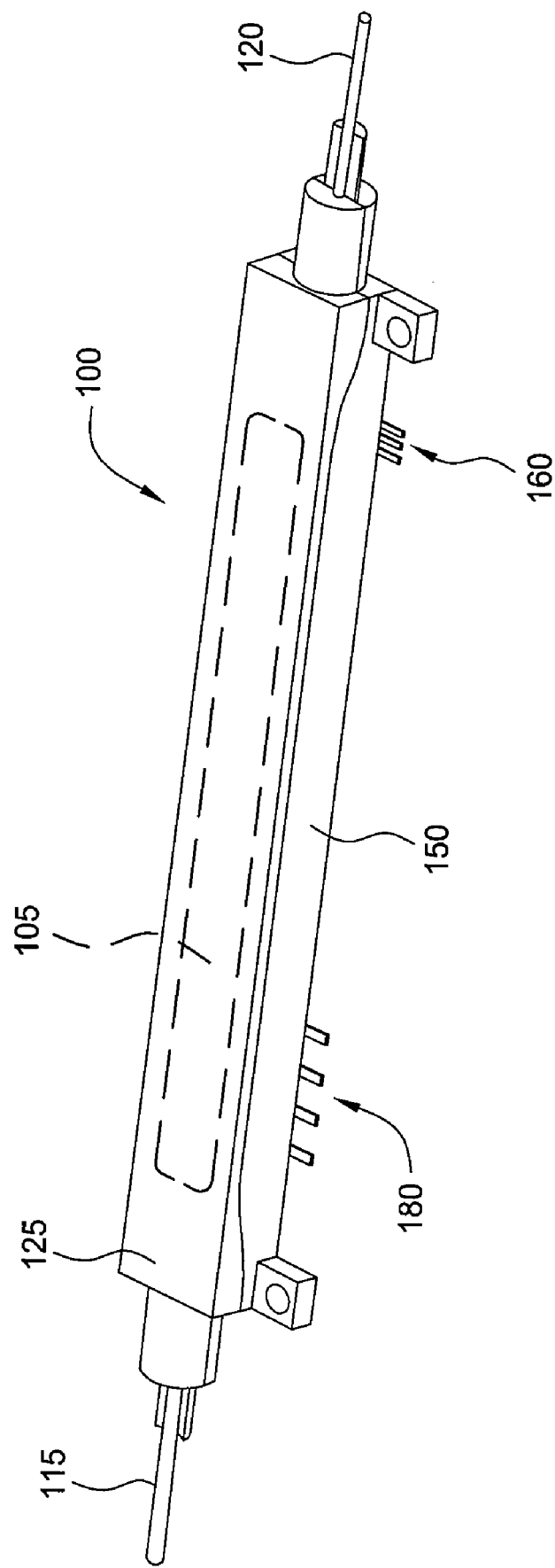
FIG. 1 is a perspective view of a module package in accordance with the present invention.
Figure 3:
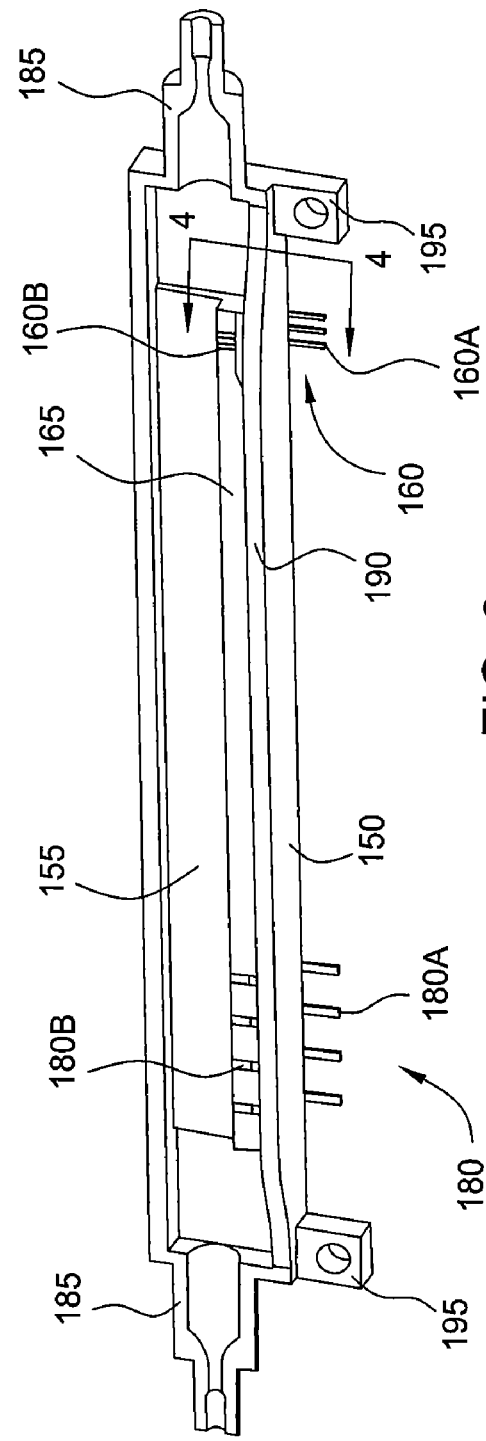
FIG. 3 is a view of a lower housing of the module package of FIG. 1.
Figure 4:
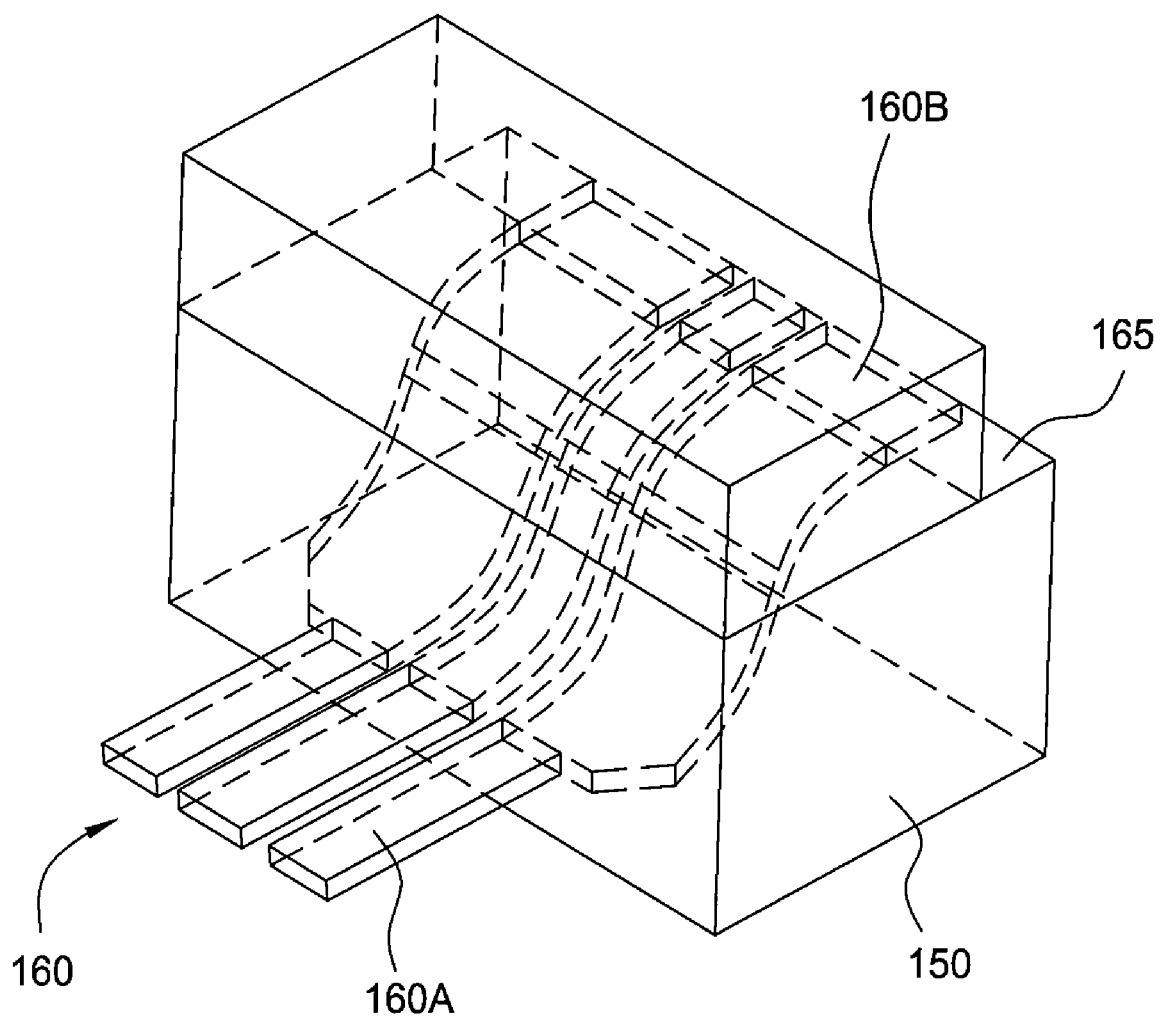
FIG. 4 is a sectional view along line 4-4 in FIG. 3 in order to illustrate a plurality of conductors disposed in the lower housing.

FIG. 1 is a perspective view of a module package 100 in accordance with the present invention. The module package 100 is generally used to protect an optoelectronic device, such as an electro-optical modulator chip 105, from the surrounding environment. The module package 100 includes a feed through that comprises a first optical fiber 115 and a second optical fiber 120. In one embodiment, the electro-optical modulator chip 105 is a LiNbO$_3$ chip. As shown, the module package 100 includes an upper housing 125 and a lower housing 150 and a plurality of conductors 160, 180. Generally, FIG. 1 illustrates an overall view of the module package 100 and FIGS. 2-4 illustrate the different components of the module package 100.

As also illustrated in FIG. 1, the housings 125, 150 are attached together and the optical fibers 115, 120 extend from each end of the module package 100. However, prior to attaching the upper housing 125 to the lower housing 150, the electro-optical modulator chip 105 is secured in the lower housing 150 by a thermoplastic resin. Next, the optical fibers 115, 120 are positioned in the lower housing 150 and are connected to the electro-optical modulator chip 105. The optical fibers 115, 120 may be connected to the electro-optical modulator chip 105 by means of fiber-blocks and UV curable adhesive in order to transmit the optical signal through the optical waveguides in the chip. After the electro-optical modulator chip 105 and any other items are secured in each housing 125, 150, the housings 125, 150 are mated together and sealed by an epoxy to form the module package 100. At the same time as the sealing of the housings 125, 150 is realized, the optical feed through in the module package 100 is also realized.

As will be discussed herein, each housing 125, 150 includes a cavity formed therein, whereby as the upper housing 125 and the lower housing 150 are mated together, the cavities interconnect to form an air cavity in the module package 100. The air cavity is typically filled only with air. However, to control the moisture content inside the module package 100, a getter may be disposed in the cavity of the upper housing 125. Generally, getter material is added to a component to absorb moisture or other impurities. Further, to control residual moisture effect on the electro-optical modulator chip 105, a non-permeable layer may be disposed on the electro-optical modulator chip 105. For instance, if the electro-optical modulator chip 105 is a LiNbO$_3$ chip, the non-permeable layer may be disposed on the bias and/or on the RF region.

Figure 2:
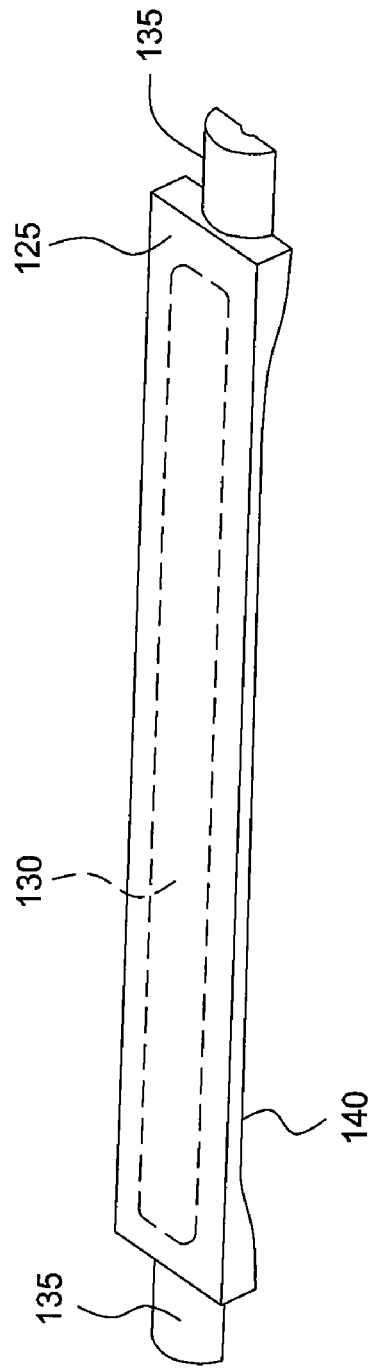
FIG. 2 is a view of an upper housing of the module package of FIG. 1.

FIG. 2 illustrates the upper housing 125 of the module package 100. For clarity purposes, the electro-optical modulator chip 105 and the optical fibers 115, 120, as shown in FIG. 1, have been removed. The upper housing 125 is made from a plastic material, such as liquid crystal polymers (LCP). As known in the art, liquid crystal polymers have good electrical and thermo mechanical properties which may prevent the thermal expansion of the module package 100.

The upper housing 125 includes a cavity 130 formed therein. The cavity 130 is designed to fit over the electro-optical modulator chip and subsequently interconnect with a cavity in the lower housing 150 to form the air cavity in the module package 100. The air cavity is typically filled only with air. In other words, the electro-optical modulator chip 105 is disposed in the module package 100 without the need for a silicon resin as required in the conventional plastic package. The air cavity in the plastic module package 100 is configured to allow the electro-optical modulator chip to have electro-optical performances (bandwith) of at least 12.5 GHz. Further, the module plastic package 100, with the air cavity arrangement, is configured to allow the electro-optical modulator chip to be Telcordia compliant. In addition, the module plastic package 100, with the air cavity arrangement, allows the electro-optical modulator chip to have an electrical return loss value (S11 value) of −10 dB or better up to at least 12.5 GHz.

The upper housing 125 further includes a seal cover 135 at each end of the upper housing 125. Each seal cover 135 is configured to seal around a portion of fiber lines at the same time the upper housing 125 and lower housing 150 are sealed. In other words, the optical feed through sealing is realized at the same time the housing 125, 150 sealing is realized. This type of arrangement eliminates the step of conventionally sealing the fiber lines in the housing and then sealing the upper and lower housing together. The upper housing 125 further includes a shaped edge 140 that mates with a corresponding shaped edge 190 in the lower housing 150.

FIG. 3 illustrates the lower housing 150 of the module package 100. For clarity purposes, the electro-optical modulator chip 105 and the optical fibers 115, 120, as shown in FIG. 1, have been removed. The lower housing 150 is made from a plastic material, such as liquid crystal polymers. The lower housing 150 includes the cavity 155 formed therein. The cavity 155 is designed to house the electro-optical modulator chip and interconnect with the cavity 130 in the upper housing 125 to form the air cavity in the module package 100.

The lower housing 150 further includes a seal cover 185 at each end of the upper housing 125. Each seal cover 185 is configured to mate with a corresponding seal cover 135 in the upper housing 125 and seal around the fiber lines at the same time the upper housing 125 and lower housing 150 are sealed. As a result, the optical feed through sealing is realized at the same time the housing 125, 150 sealing is realized. The lower housing 150 further includes a shaped edge 190 that mates with the shaped edge 140 in the upper housing 125.

As also shown in FIG. 3, the lower housing 150 includes a support member 165 that is configured to support the electro-optical modulator chip. Since the lower housing 150 is made from a plastic material, a thermoplastic resin is typically employed to attach the electro-optical modulator chip to the support member 165. The thermoplastic resin is also used to avoid Vq drift problems due to the piezoelectric effect on the electro-optical modulator chip. The piezoelectric effect generally occurs due to a charge generation where a stress gradient is applied. To further avoid Vq drift problems due to the piezoelectric effect, the electro-optical modulator chip may include a continual metallization on a side thereof. In one embodiment, the electro-optical modulator chip may be attached to a base of the lower housing 150 via a flip-chip packaging technique or with a face-up packaging technique. In the face-up packaging technique, the surface of the chip is free from optical and electrical waveguides.

The support member 165 is interconnected with conductors 160 on one side of the lower housing 150 and conductors 180 on another side of the lower housing 150. The plurality of conductors 160, 180 are positioned in the lower housing 150 such that an upper portion 160B, 180B of each conductor 160, 180 is attached to the support member 165 and a lower portion 160A, 180A of each conductor 160, 180 extend from a lower end of the housing 150. The upper portion 160B, 180B of each conductor 160, 180 is configured to electrically connect with the electro-optical modulator chip. The lower portion 160A, 180A of each conductor 160, 180 is configured to electrically connect with a circuit board (not shown). As further shown in FIG. 3, the lower housing 150 includes a connection member 195 at each end thereof. Each connection member 195 is configured to secure the module package 100 to the circuit board.

FIG. 4 is a sectional view along line 4-4 in FIG. 3 in order to illustrate the conductors 160 disposed in the lower housing 150. For clarity purposes, only conductors 160 are shown in FIG. 4. It is to be understood, however, that the conductors 180 of FIG. 3 have a similar configuration as the conductors 160 shown in FIG. 4. As clearly depicted, the upper portion 160B of each conductor 160 is attached to the support member 165 and the lower portion 160A of each conductor 160 extends from the lower housing 150. This coplanar structure integrated into the lower housing 150 is configured to allow the electro-optical modulator chip housed in the module package 100 to have a RF transition design that is capable of performances of up to 20 GHz. In other words, the performance of up to 20 GHz is achieved due to the fact that the coplanar structure is integrated into the module package 100 and the optical modulator chip is disposed in the air cavity of the module package 100. Further, in this arrangement, the plastic material of the housing 150 is used as a dielectric between the metallic conductors 160. Additionally, as shown in FIG. 4, the conductors 160 are bent inside the plastic material of the lower housing 150 to avoid inductance parasitic effects on RF performances and to realize the transition between the chip level inside the package and the external connection level connection (at the bottom of the package).

In another embodiment, the optoelectronic device is a traveling wave structure chip. A traveling wave structure chip is typically sensitive to the electromagnetic compatibility. Generally, electromagnetic compatibility deals with unintentional generation, propagation, and reception of electromagnetical energy with reference to the unwanted effects that such an energy may induce. To combat the effects of electromagnetic compatibility in this embodiment, a filler can be used to cover all the chip or a metal deposition can be applied to a wall of the module package or a base can also be added to the module package.

While the foregoing is directed to embodiments of the present invention, other and further embodiments of the invention may be devised without departing from the basic scope thereof, and the scope thereof is determined by the claims that follow.

The invention claimed is:

1. A module package for a high frequency optoelectronic device comprising:
 an upper plastic housing having an upper cavity formed therein and a first seal cover;
 a lower plastic housing having a lower cavity formed therein and a second seal cover, wherein the upper housing and the lower housing are configured to mate together such that the cavities form an enclosed air cavity between the housings and the first and second seal covers form an optical feed through that accommodates an optical fiber in a sealed manner when the upper plastic housing is secured to the lower plastic housing; and
 a plurality of conductors disposed in the lower housing, each conductor having an upper end and a lower end, wherein the upper end is connectable to a chip disposed in the air cavity and the lower end is connectable to a board.

2. The module package of claim 1, wherein the upper and lower housings are made from liquid crystal polymers.

3. The module package of claim 1, further including a getter attached to a portion of the upper plastic housing to control the moisture content in the air cavity.

4. The module package of claim 1, wherein a resin is employed to attach the chip to the lower plastic housing.

5. The module package of claim 1, wherein the chip is a $LiNbO_3$ chip.

6. The module package of claim 5, wherein the optical device is an electro-optical modulator with an electro-optical performance of at least 12.5 GHz.

7. The module package of claim 5, wherein the optical device is an electro-optical modulator with an electro-optical performance up to 20.0 GHz.

8. The module package of claim 1, wherein the chip is a traveling wave structure chip.

9. The module package of claim 8, wherein a metal deposition is placed on at least a portion of the air cavity.

10. The module package of claim 1, wherein the connectors are configured such that an external connection to the board is at a lower end of the module package.

11. A package assembly for an electro-optical modulator comprising:
 an upper plastic body having an upper cavity formed therein;
 a lower plastic body having a lower cavity formed therein and a plurality of conductors, wherein the upper and lower bodies are configured to mate together such that an enclosed air cavity is formed and a first optical feed through is formed to accommodate a first optical fiber in a sealed manner and a second optical feed through is formed to accommodate a second optical fiber in a sealed manner; and
 a chip disposed in the air cavity such that the chip contacts the plurality of conductors.

12. The package assembly of claim 11, wherein the electro-optical modulator has an electro-optical performance of at least 12.5 GHz.

13. The package assembly of claim 11, wherein the upper and lower bodies are made from liquid crystal polymers.

14. The module package of claim 1, wherein the optical feed through comprises a first optical fiber and a second optical fiber which are connectable to the chip.

15. A method of packaging and assembling a high frequency optical device, the method comprising:
 providing a lower plastic housing having a lower cavity formed therein, wherein the lower plastic housing includes a plurality of conductors disposed therein;
 placing a chip in the cavity of the lower plastic housing such that a chip contacts a portion of the plurality of conductors;
 placing a first optical fiber and a second optical fiber in the lower plastic housing and connecting the fibers to the chip; and
 securing an upper plastic housing to the lower plastic housing such that an air cavity is formed between the housings and a first optical feed through is formed to accommodate the first optical fiber in a sealed manner and a second optical feed through is formed to accommodate the second optical fiber in a sealed manner.

16. A method of packaging and assembling a high frequency optical device, the method comprising:
 providing a lower plastic housing having a lower cavity formed therein, wherein the lower plastic housing includes a plurality of conductors disposed therein;
 placing a chip in the cavity of the lower plastic housing such that a chip contacts a portion of the plurality of conductors;
 placing a getter on a portion of the upper plastic housing to control moisture content in the air cavity;
 mating an upper plastic housing with the lower plastic housing such that an air cavity is formed between the housings; and
 creating a seal between the upper and lower housings.

17. The method of claim 16, further including placing a thermoplastic resin on a portion of the lower plastic housing to secure the chip in the housing.

18. The method of claim 16, wherein the chip is a $LiNbO_3$ chip.

19. The method of claim 18, wherein the optical device is an electro-optical modulator with an electro-optical performance of at least 12.5 GHz.

20. The method of claim 18, wherein the optical device is an electro-optical modulator with an electro-optical performance up to 20.0 GHz.

21. The method of claim 16, further including placing a first optical fiber and a second optical fiber in the lower plastic housing and connecting the fibers to the chip to create an optical feed through.

22. The method of claim 21, wherein the optical feed through is sealed as the seal is created between the upper and lower housings.

23. The module package of claim 1, wherein the size of an opening in the optical feed through is substantially the same as the size of the optical fiber that is accommodated in the optical feed through.

24. The method of claim 15, wherein the size of an opening in the respective optical feed through is substantially the same as the size of the optical fiber that is accommodated in the optical feed through.

* * * * *